United States Patent [19]

Weiswurm

[11] Patent Number: 4,695,482
[45] Date of Patent: Sep. 22, 1987

[54] METHOD AND APPARATUS FOR COATING OF CIRCUIT BOARDS

[76] Inventor: Klaus D. Weiswurm, 818 E. Myrtle St., San Antonio, Tex. 78212

[21] Appl. No.: 821,404

[22] Filed: Jan. 21, 1986

[51] Int. Cl.⁴ .............................................. B05D 5/12
[52] U.S. Cl. ..................................... 427/96; 118/324; 118/314; 118/304; 118/680; 118/681; 118/682; 118/683; 118/676
[58] Field of Search .......................... 427/96; 428/901; 118/324, 314, 304, 680, 681, 682, 683, 676

[56] References Cited

U.S. PATENT DOCUMENTS

| | | | |
|---|---|---|---|
| 3,565,319 | 2/1971 | Eschenbrucher | 220/37 |
| 3,705,457 | 12/1972 | Tardoskegyi | 427/96 |
| 4,454,003 | 6/1984 | Fishman | 118/314 |
| 4,488,505 | 12/1984 | Schaming | 118/630 |
| 4,493,286 | 1/1985 | Carson | 118/683 |
| 4,560,584 | 12/1985 | Henninger | 427/96 |

OTHER PUBLICATIONS

Technical Devices Company Mark I Model B Wave Soldering Machine brochure.

Primary Examiner—John D. Smith
Assistant Examiner—Vi Duong Dang
Attorney, Agent, or Firm—Cox & Smith Inc.

[57] ABSTRACT

Method and apparatus for applying a flow of insulating material such as silicone to predetermined locations on printed circuit boards to avoid damaging the components on the circuit boards, such as solenoids and buzzers, whose functions will be impaired by the application of such material thereto. The apparatus is comprised of a pump which delivers a flow of insulating material to a manifold, the manifold having a plurality of lengths of flexible tubing attached thereto which serve as nozzles for dispensing the flow of insulating material. A printed circuit board is mounted on a conveyor and the conveyor is advanced until the printed circuit board is under the manifold, at which time the manifold is lowered to place the nozzles in close proximity to the printed circuit board so that the flow of insulating material will be directed to predetermined locations on the printed circuit board. The flexible nozzles are selectively positioned to direct the flow to those predetermined locations. A wave coating apparatus is provided to coat the bottom of the printed circuit board.

21 Claims, 13 Drawing Figures

METHOD AND APPARATUS FOR COATING OF CIRCUIT BOARDS

BACKGROUND OF THE INVENTION

The present invention relates to a method and apparatus for coating circuit boards with insulating and/or waterproofing material. More particularly, the present invention relates to the application of a measured amount of an insulating material such as silicone to predetermined locations on a printed circuit board and the hardening of that insulating material into a coating which waterproofs or otherwise insulates the printed circuit board from external influences.

Printed circuit boards are being used in more and more applications in which they are exposed to external influences such as moisture, thermal changes, and vibration. Most importantly, and of dire consequence to the operation of the printed circuit on the circuit board, is the exposure of the printed circuit board to moisture or condensation. For example, the printed circuit boards which are being used in automobiles are often subjected to drastic changes in temperature and humidity such that moisture condenses on the printed circuit board.

To prevent the damage and/or malfunction of the printed circuit board from exposure to elements such as water, the circuit board must be coated with an insulating material. This insulating material is generally silicone or a silicone derivative, but plastic polymers and acrylics can also be coated onto the printed circuit board to provide the necessary protection. Present methods involve the application of the insulating material to the printed circuit boards by either dipping the circuit board into a container of liquid insulating material or spraying the insulating material onto the circuit board. A necessary and time consuming prerequisite to the dipping or spraying of the circuit board is the masking of those components on the printed circuit board which can be damaged by the insulating material itself. For instance, connectors, buzzers, solenoid valves and many other components on the printed circuit board cannot be coated with the insulating material without impairment of their function.

There is, therefore, a need for a method and apparatus which coates the printed circuit board with insulating material without coating those components whose function will be impaired by being coated with insulating material. There is also a need for an apparatus which will coat the printed circuit board with insulating material without the necessity of masking those components which will be damaged by exposure to the insulating material, thereby avoiding the time-consuming and expensive prerequisite of masking those components.

It is, therefore, an object of the present invention to provide an apparatus and method for coating printed circuit boards with insulating material which avoids the necessity of masking sensitive components before application of the insulating material.

Another object of the present invention is to provide an apparatus for coating printed circuit boards with insulating material which comprises a manifold having an inlet in fluid communication with a source of insulating material and a plurality of outlets with a length of flexible tubing attached to each of the outlets, the tubing being selectively bendable to direct insulating material to a predetermined location on a printed circuit board, means for positioning the printed circuit board in preselected, spaced relationship with the manifold, and means for pumping a measured amount of insulating material through the manifold and out the lengths of flexible tubing onto a printed circuit board.

Another object of the present invention is to provide a method of coating printed circuit boards with insulating material comprising mounting a printed circuit board to a conveyor and moving the conveyor, stopping the conveyor when the printed circuit board is under a manifold having a plurality of lengths of flexible tubing mounted thereto, each length of flexible tubing being in fluid communication with a source of insulating material, bending the lengths of flexible tubing to direct a flow of insulating material to a predetermined location on the printed circuit board under the manifold, and delivering a measured flow of insulating material to the printed circuit board through the lengths of flexible tubing.

Another object of the present invention is to provide a method for coating printed circuit boards with insulating material which does not require the masking of the sensitive components on the printed circuit board before the application of the insulating material.

Still another object of the present invention is to provide an apparatus capable of coating both sides of the printed circuit board without immersing the printed circuit board in the insulating material used to coat the circuit board.

Other objects of the present invention will be clear to those skilled in the art who have the benefit of this disclosure from the following detailed description of the invention.

SUMMARY OF THE INVENTION

These objects are achieved by providing an apparatus for the coating of printed circuit boards with insulating material which comprises a manifold having an inlet in fluid communication with a source of insulating material and a plurality of outlets and a length of flexible tubing attached to each of the outlets, the flexible tubing being selectively bendable to direct insulating material to a predetermined location on the printed circuit board. Means is provided for positioning a printed circuit board in a preselected, spaced relationship to said manifold, and a means is provided for pumping a measured amount of insulating material through the manifold and out the lengths of flexible tubing onto the printed circuit board.

Also provided is an apparatus for coating printed circuit boards with insulating material which comprises a source of insulating material and a manifold in fluid communication with that source. A conveyor moves a printed circuit board under the manifold. A plurality of flexible nozzles are provided that are in fluid communication with the manifold, the flexible nozzles being selectively bendable to direct a flow of insulating material to predetermined locations on the top of a printed circuit board as the printed circuit board moves under the manifold on the conveyor. Means is also provided in fluid communication with the source of insulating material for coating the bottom of the printed circuit board with the insulating material as the printed circuit board moves on the conveyor.

The present invention is also directed to a method of coating printed circuit boards with insulating material which comprises mounting a printed circuit board to a conveyor, moving the conveyor and stopping the conveyor when the printed circuit board is under a manifold having a plurality of lengths of flexible tubing mounted thereto, each of said lengths of flexible tubing being in fluid communication with a source of insulating material. The lengths of flexible tubing are bent to direct a flow of insulating material to predetermined locations on the printed circuit board under the manifold, and a measured flow of insulating material is delivered to the printed circuit board through the lengths of flexible tubing.

BRIEF DESCRIPTION OF THE DRAWINGS

FIG. 5 is an enlarged sectional view of a portion of FIG. 4.

FIGS. 6A and 6B are enlarged sectional views similar to FIG. 5 showing an alternative embodiment of the clip used to retain the printed circuit board on the conveyor of the apparatus of FIG. 2 and the use of that clip.

DETAILED DESCRIPTION OF THE INVENTION

Figure 1:
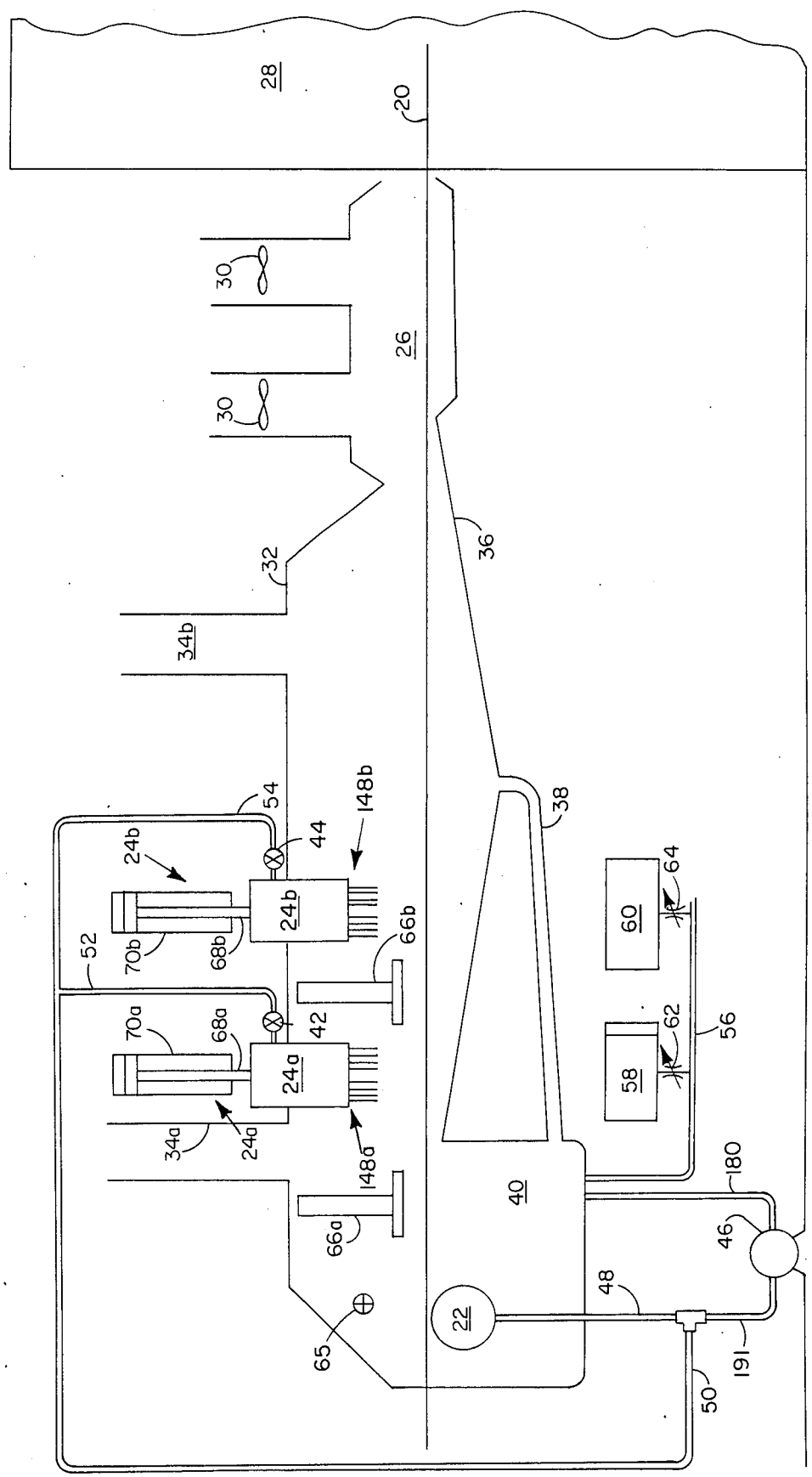
FIG. 1 is a schematic diagram of the method and apparatus of the present invention.

Referring to FIG. 1, there is shown a schematic diagram of the apparatus of the present invention. Printed circuit boards (not shown) are mounted on the conveyor 20 for movement therealong over a wave apparatus 22 and underneath one or more top coating devices 24, two being shown at reference numerals 24a and 24b. The printed circuit board is coated with liquid insulating material delivered by the wave apparatus 22 and top coating devices 24a and 24b, and continues along the conveyor 20 to a flash off zone 26 and into an oven 28 in which the insulating material is heated to cure the insulating material into a coating on the outside of the printed circuit board. Conveyor 20 is a continuous conveyor, and may be provided with several spiral loops inside oven 28 to insure that printed circuit boards which have been coated with insulating material are retained within the oven 28 for a long enough period of time to insure the curing of the insulating material into a waterproof coating.

The flash off zone 26 is provided with fans 30 to circulate air over the printed circuit boards on the conveyor 20. The coating of the circuit boards with the insulating material is accomplished under hood 32 having vents 34a and 34b therein to remove accumulated vapors from the liquid insulating material. A catch basin 36 is provided underneath the conveyor 20 to catch the overflow of insulating material from the top coating devices 24a and 24b and return the overflow through return line 38 to the main reservoir 40 of insulating material. Main reservoir 40 is provided with an output line 180 connected to diaphragm pump 46 which pumps the insulating material into line 191 which splits into the wave apparatus feed line 48 and top coating device feed line 50. The top coating device feed line 50 splits into top coating feed lines 52 and 54, which supply insulating material to the top coating devices 24a and 24b, respectfully.

Feed line 56 connects reservoirs containing the xylene carrier 58 and silicone 60 when, for instance, the insulating material used to coat the printed circuit boards is silicone, to main reservoir 40. The device of the present invention is also adaptable for use in coating printed circuit boards with other materials such as certain acrylic materials. Valves 62 and 64 are provided to adjust the proportion of xylene and silicone, respectively delivered to feed line 56 from reservoirs 58 and 60 in response to the input from the float valve for the silicone which is a vicosity control (not shown) which hangs in reservoir 40. Viscosity controls are available commercially, and operate to control the valves 62 and 64 of the silicone 58 and xylene 60 reservoirs, respectively.

Proximity sensor 65 is provided which is responsive to the leading edge of each extension arm 98 (not shown in FIG. 1, see FIGS. 2-8) to engage the air clutch/brake of the motor (not shown) which drives conveyor 20. Each of the top coating devices 24a and 24b is comprised of a manifold, shown schematically at 148a and 148b, mounted on the rams 68a and 68b of pneumatic cylinders 79a and 79b, respectively. Each of the manifolds 148a and 148b is provided with a plurality of lengths of flexible tubing 158a and 158b, the manifolds 148a and 148b and lengths of flexible tubing 158a and 158b being in fluid communication with the top coating device feed line 50 through top coating feed lines 52 and 54, respectively. An identifier 66a and 66b is provided for each top coating device 24a and 24b and positioned so as to detect the presence of a printed circuit board having a particular shape on conveyor 20. Both identifiers 66a and 66b can be positioned at the same position relative to the printed circuit board mounted on conveyor or, if two or more printed circuit boards having different sizes and or shapes are to be coated, one identifier can be positioned to detect one type of printed circuit board and the other positioned to detect the other type of printed circuit board.

Each of the identifiers 66a and 66b activates a respective pneumatic cylinder 70a or 70b to lower manifold 148a or 148b, respectively, into close proximity to the surface of the appropriately sized/shaped printed circuit board for a predetermined period of time. The lowering of the respective manifold 148a and/or 148b occurs while conveyor 20 is stopping in response to the detection of the leading edge of each extension extension arm 98 by proximity sensor 65 so that, when conveyor 20 is stopped, the printed circuit board mounted thereon of the proper size and shape will be positioned directly under the manifold 148a and/or 148b and the lengths of flexible tubing 158 are positioned to deliver the liquid insulating material to selected locations on the respective printed circuit boards. At the same time, pilot-operated valves 42 and 44 are actuated to allow liquid insulating material to be delivered to the printed circuit boards under pressure from pump 46. After a predetermined period of time, valves 42 and 44 are closed, rams 68a and 68b are retracted, and the air clutch/brake of the motor is disengaged, allowing conveyor 20 to advance.

Figure 2:
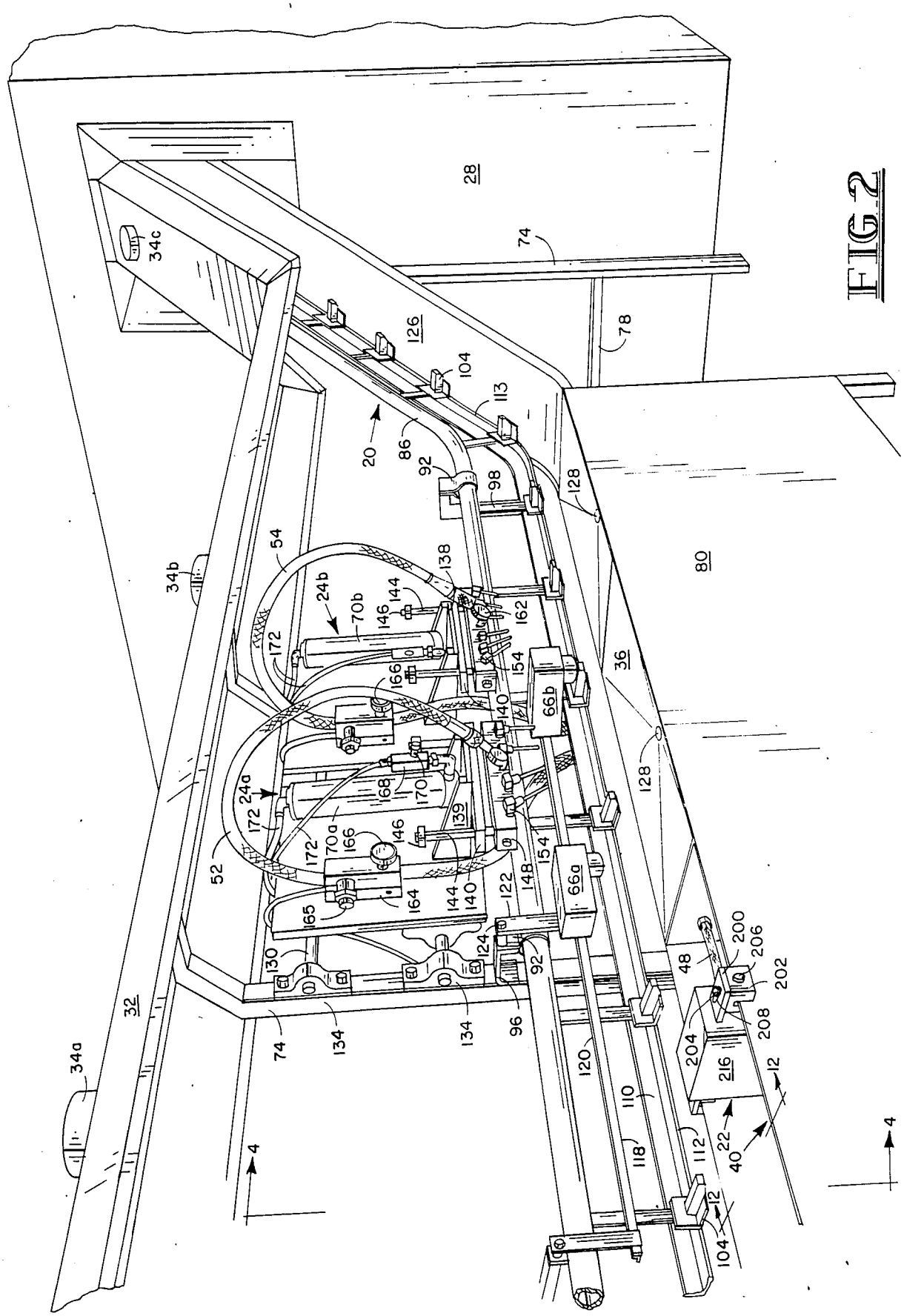
FIG. 2 is a perspective view of a portion of an apparatus constructed according to the teachings of the present invention.
Figure 3:
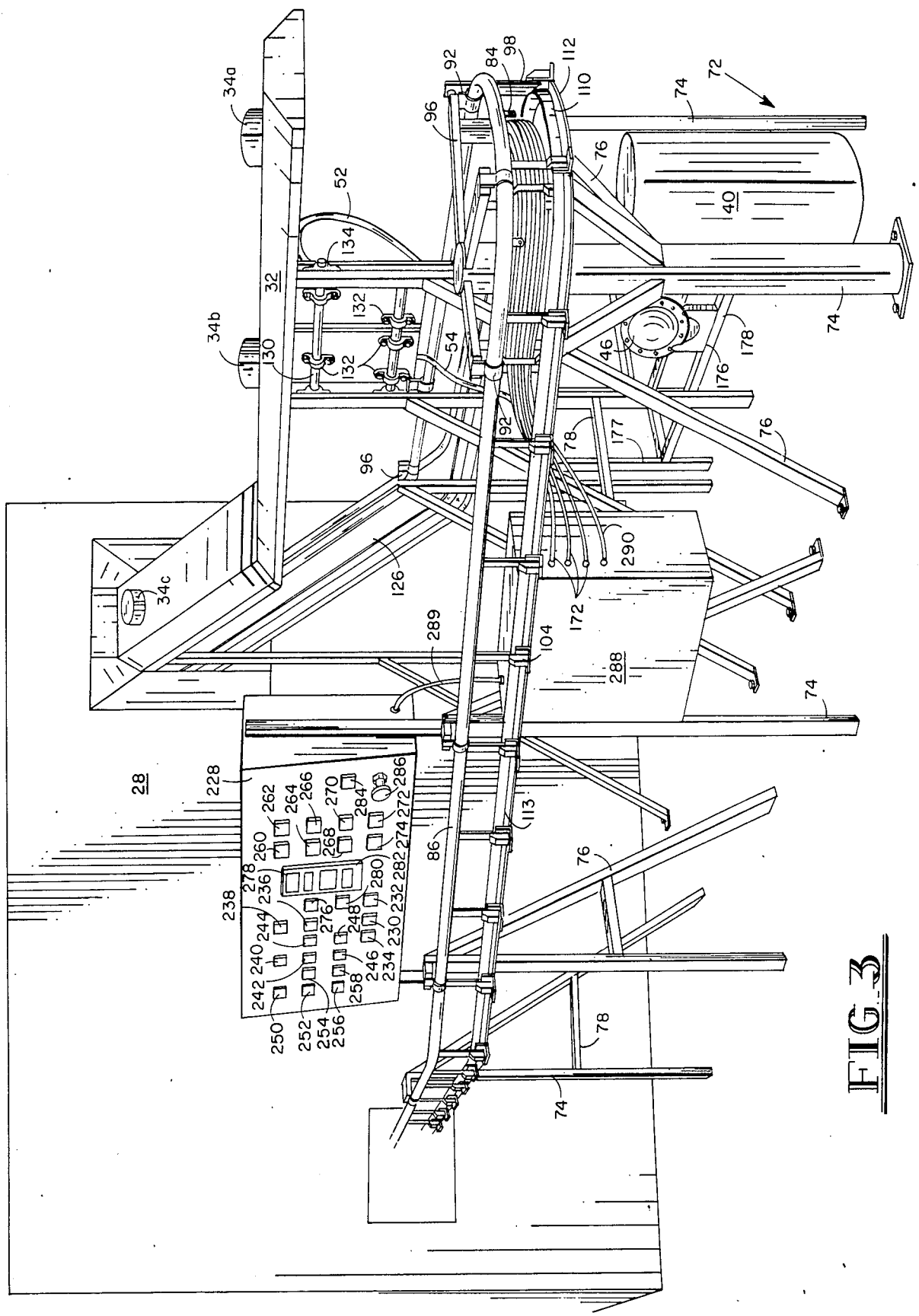
FIG. 3 is a perspective view of a portion of the apparatus of FIG. 2.
Figure 4:
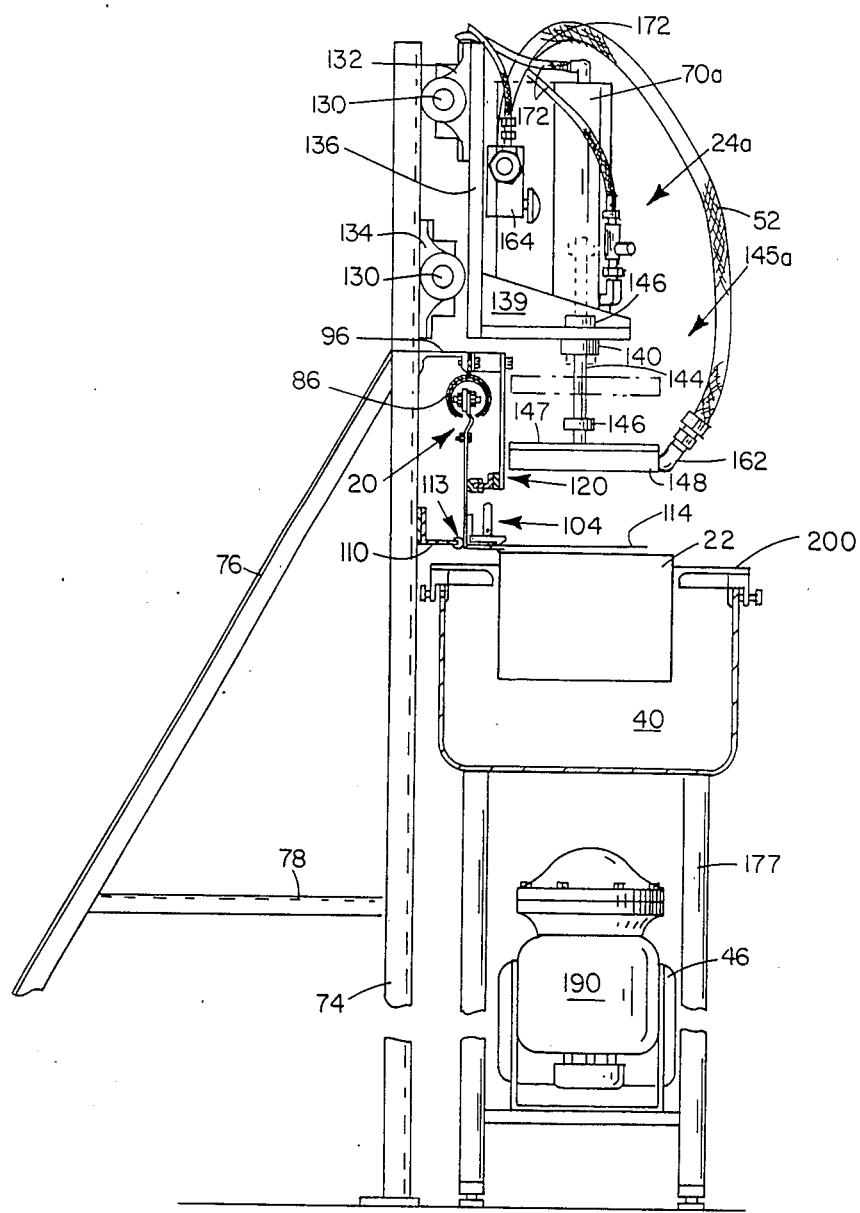
FIG. 4 is a sectional view of the apparatus of FIG. 2 taken along the lines 4—4 in FIG. 2.
Figures 5, 6A:
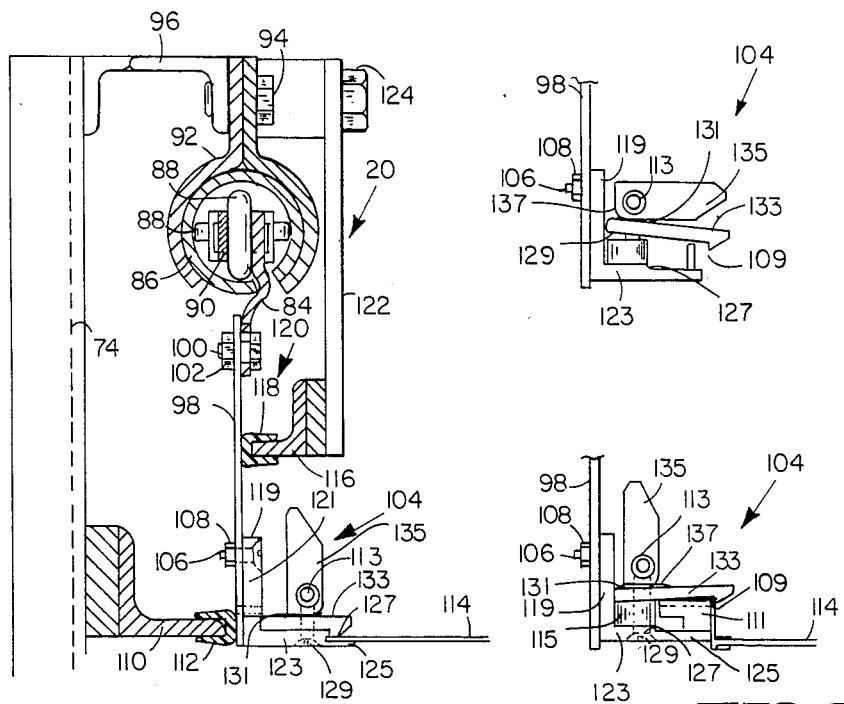

Referring to FIGS. 2 and 3, an apparatus constructed according to the teachings of the present invention is shown. The apparatus is constructed on a frame, indicated generally at reference numeral 72, constructed of a plurality of vertical members 74, each of which is braced by a strut 76 and brace 78. Skirting 80 is provided to enclose the pump 46 (see FIGS. 3 and 9) and other components to prevent damage thereto (the skirting is not shown in FIG. 3 for purposes of clarity). The conveyor 20 is mounted on the frame 72 and, as shown in FIGS. 4 and 5, is comprised of a plurality of links, each link being made up of roller arms 84 mounted on conveyor 20 which rides in a track 86 on rollers 88. Track 86 is retained within a pair of semicircular members 92 (best shown in FIG. 5) which are held in closely opposed relationship by bracket 96, the bracket 96 being secured to the vertical member 74 at intervals along conveyor 20 by bolts 94. An extension arm 98 is secured to each roller arm 84 by bolt 100 and nut 102, and a clip, indicated generally at 104, is secured to the extension arm 98 by bolt 106 and nut 108. This type of articulated chain may be purchased commercially from a number of suppliers. In a presently preferred embodiment, the articulated chain and other components of conveyor 20 comprise an enclosed track conveyor purchased from the Logan Co. (Louisville, Ky.)

As shown in FIG. 3, extension arms 98 are secured to every other roller arm 84 on conveyor 20. Depending upon the size of the printed circuit boards mounted on conveyor 20 and the desired speed of production, extension arms 98 can be mounted on every roller arm 84.

A guide rail 110 is secured at appropriate intervals to the vertical members 74 and is provided with a wear strip 112 which forms a bearing surface to support the clips 104 as they proceed around the conveyor 20. To insure the accurate positioning of a clip 104, bearing a printed circuit board 114 thereon, underneath a particular top coating device 24a or 24b, the conveyor 20 is provided with a guide rail 116 bearing a wear strip 118 thereon to form a bumper rail 120 in that portion of conveyor 20 under top coating devices 24a and 24b. This bumper rail 120 is supported by a plurality of vertical brackets 122 secured to brackets 96 by bolts 124. The even pressure applied by the guide rail 110 against the extension arm 98 in the horizontal direction away from the vertical members 74 is counteracted in the area of the top coating devices 24a and 24b by the even pressure exerted by the bumper rail 120 in the horizontal direction toward the vertical members 74 to insure the proper positioning of the printed circuit board 114 relative to the top coating devices 24a and 24b.

Clip 104 is shown in more detail in FIGS. 5, 6A and 6B. Referring first to FIG. 5, the base 119 of clip 104 is attached to extension arm 98 by the above-described nut 108 and bolt 106, and is comprised of a vertical 121 and horizontal 123 portion. The horizontal portion 123 of base 119 is provided with a thin portion 125 at its end such that the printed circuit board 114 may be inserted into clip 114 against the stop 127. The horizontal portion 123 of base 119 is also provided with a bolt 129 extending upwardly therethrough which forms an axis for retention of member 133 and tab 135. A belvel washer 131 is interposed between the top surface of member 133 and the bottom surface of tab 135 around bolt 129. The bottom surface of tab 135 is beveled at 137, and tab 135 is pivotally mounted on bolt 129. A set screw 113 is provided for vertical placement of tab 135 on bolt 129.

Construction of clip 104 in this manner allows the insertion of printed circuit board 114 and retention on clip 104 as follows. Tab 135 is placed initially in the horizontal position (shown in FIG. 6B for an alternative embodiment of a clip according to the teachings of the present invention and (described below), and a printed circuit board 114 is inserted into clip 104 until the edge of the printed circuit board 114 engages stop 127. The tab 135 is then raised to the vertical position shown in FIGS. 5 (and 6A in the case of the alternative embodiment), the upward bias imparted to tab 135 by belvel washer 131 and the beveled surface 137 of tab 135 cooperating to cause member 133 to firmly engage the top surface of the printed circuit board 114.

In the alternative embodiment of clip 104 shown in FIGS. 6A and 6B, printed circuit board 114 can also be inserted into clip 104 and frictionally retained by engagement of the Molex connector 111 of the printed circuit board 114. The Molex connector 111 is retained between the thin portion 125 of the horizontal portion 123 of clip 104 and member 133, a stop shoulder 109 being provided on the bottom of member 133 to engage the corner of the Molex connector 111 of printed circuit board 114. The clip 104 shown in FIGS. 6A and 6B is provided with a spacer block 115 between member 133 and the horizontal portion 123 of base 119 and bolt 129 is lengthened in comparison to the length of bolt 129 in the embodiment shown in FIG. 5 in order to extend therethrough. The stop shoulder 109 of member 133 of the clip 104 shown in FIGS. 6A and 6B is, like the clip 104 of FIG. 5, constructed so that a printed circuit board 114 retained therein will be slanted slightly downwardly from the horizontal so that excess liquid insulating material will run off of the printed circuit board 114 away from clip 104 after being dispensed onto printed circuit board 114 and collected in catch basins 36.

A pin 117 (not shown in FIGS. 5 and 6A for purposes of clarity; see FIG. 6B) may be mounted in a hole (not numbered) in the thin portion 125 of base 119 to serve as a stop member against which the printed circuit board 114 may be positioned. Use of pin 117 helps insure accurate positioning of the printed circuit boards 114 on clips 104 to help direct the liquid insulating material to preselected locations on the printed circuit boards 114 as will be explained.

Frame 72 supports the catch basins 36 under the top coating devices 24a and 24b, as well as the splash pin 126 (FIG. 2). Excess insulating material drips off of the printed circuit boards 114 after being applied thereto by the top coating devices 24a and 24b and wave apparatus 22 onto the splash pin 126 and into the catch basin 36. The catch basins 36 are provided with drains 128 which lead to the return line 38, which returns the excess insulating material to the main reservoir 40 (see FIG. 1).

Frame 72 also supports hood 32 in the vicinity of the top coating devices 24a and 24b. As noted above, hood 32 is provided with a plurality of vents 34a, 34b and 34c to remove the vapors from the carrier of the insulating material as it is applied to the printed circuit boards 114. The hood 32 can be provided with clear plastic drapes (not shown) which extend down from the edges of the hood 32 to the top of the skirting 80 to provide further confinement of the vapors from the carrier of the insulating material.

Figure 7:
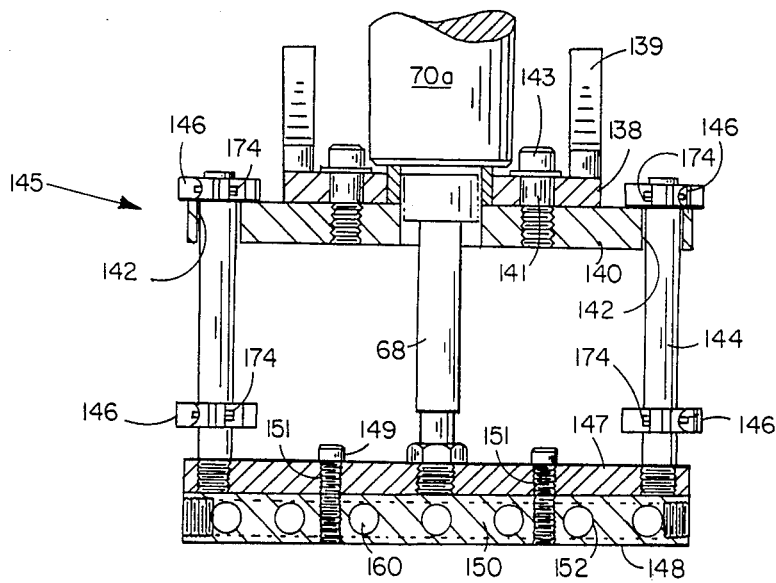
FIG. 7 is an enlarged frontal view of the manifold assembly of the apparatus shown in FIG. 2.
Figure 8:
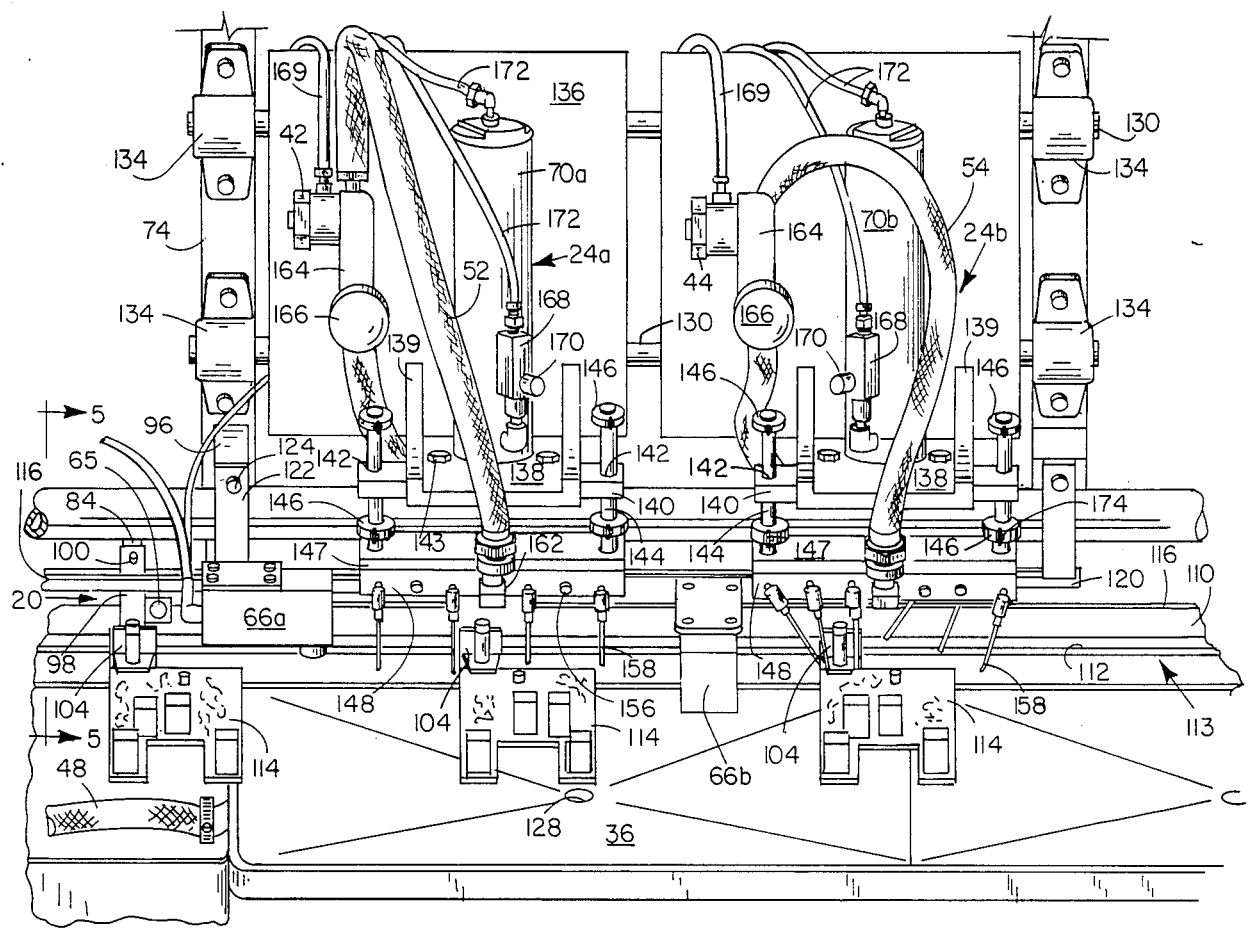
FIG. 8 is a perspective view of a portion of the apparatus of FIG. 2.

Referring now to FIGS. 7 and 8, the top coating devices 24a and 24b are mounted to frame 72 on horizontal bars 130. As shown in FIGS. 2 and 3, the top coating devices 24a and 24b are mounted to the horizontal bars 30 by ears 132, and horizontal bars 130 are secured to the vertical members 74 of frame 72 by similar ears 134. Each of the top coating devices 24a and 24b is comprised of a mounting platform 136 supporting an integral base 138 thereon. Flanges 139 integral with base 138 and mounting platform 136 are provided for additional rigidity. The pneumatic cylinders 70a and 70b are mounted to the bases 138, and an integral plate 140 having holes 142 at each end thereof is mounted to each base 138 by the studs 141 onto which nuts 143 are threaded. The holes 142 serve as a guide for the vertical guide members 144 which extend therethrough, each of the guide members 144 being provided with a split locking collars 146 at the top and bottom. Guide members 144 are integral at their bottom end with manifold plate 147, to which manifold 148 is mounted by means of bolts 149 threaded onto the studs 151 which are integral with manifold 148 and which extend upwardly through manifold plate 147.

As shown in FIG. 7, the manifold 148 encloses a space 150, the space 150 opening to the outside through the threaded holes 152 around the edges thereof. Each of the threaded holes 152 is provided with a fitting 154 or plug 156 (not shown in FIG. 7 for purposes of clarity) as will be explained. The fittings 154 (see FIG. 8) are provided with lengths of flexible tubing 158, the length of each piece of tubing 158 being selected according to the configuration of the printed circuit board 114 which is to be coated with the insulating material as will be described. The lengths of flexible tubing 158 form nozzles through which the insulating material is directed onto the printed circuit board 114 mounted on conveyor 20 at predetermined locations when the printed circuit board 114 stops under top coating devices 24a and/or 24b.

The center threaded hole 160 in manifold 158 is provided with a fitting 162 to which the connector lines 54 are attached. A needle valve 164 is provided in each of the top coating feed lines 52 and 54 to regulate the amount of insulating material which flows into the space 150 in manifold 148. Knob 166 is provided to adjust the needle valve 164. Pilot-operated valves 42 and 44 are provided to open and close needle valve 164 in top coating feed lines 52 and 54, respectively, under the influence of the air pressure supplied by line 169. The air pressure in line 169 is alternately switched on and off by a solenoid valve (not shown) in circuit box 288 (see FIG. 3) which is responsive to the signal from proximity sensor 65 to deliver liquid insulating material to the printed circuit board 114 under pressure from pump 46.

A valve 168 having adjustment knob 170 thereon is also provided to adjust the amount of air pressure applied to the pneumatic cylinders 70a and 70b, thereby controlling the extension of the ram 68. Appropriate pneumatic lines are shown at reference numeral 172. Extension of the ram 68 is controlled by positioning of the split locking collars 146, each of which can be raised or lowered on members 144 and held in place by set screw 174.

Figure 9:
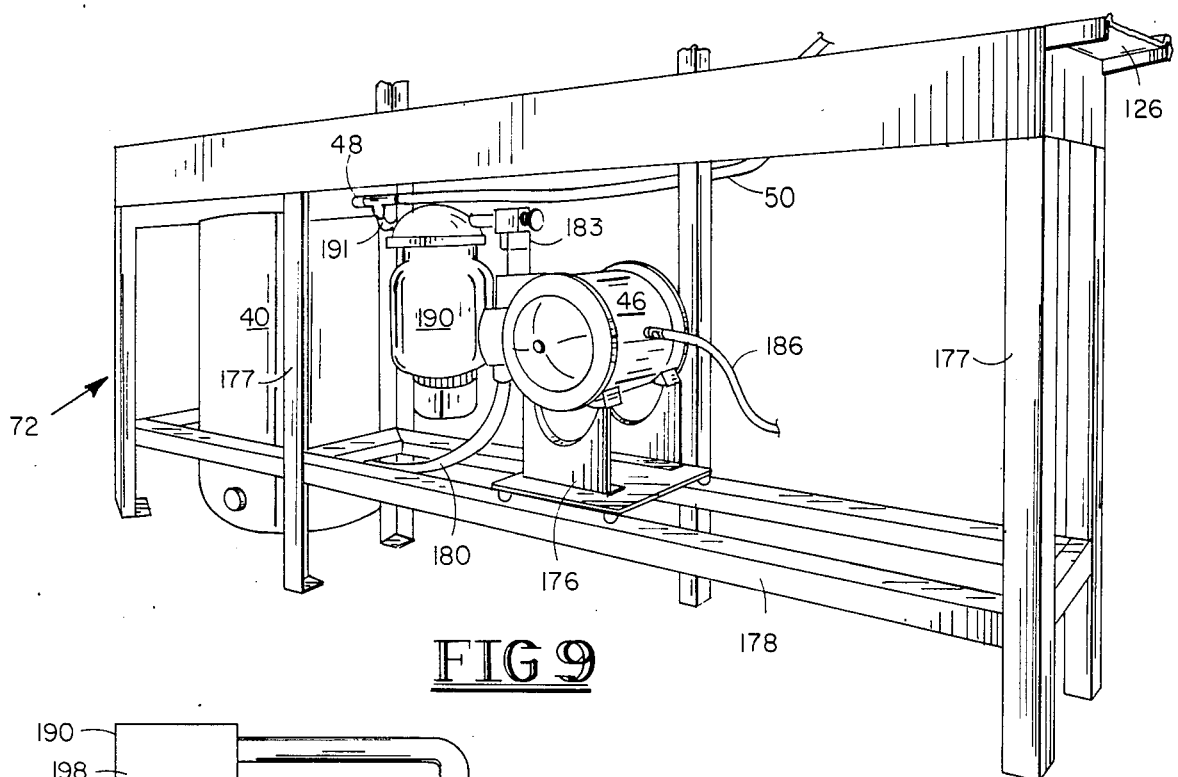
FIG. 9 is a perspective view of a portion of the apparatus of FIG. 2 with the skirting removed therefrom to show the details of the pump which is mounted thereto.
Figure 10:
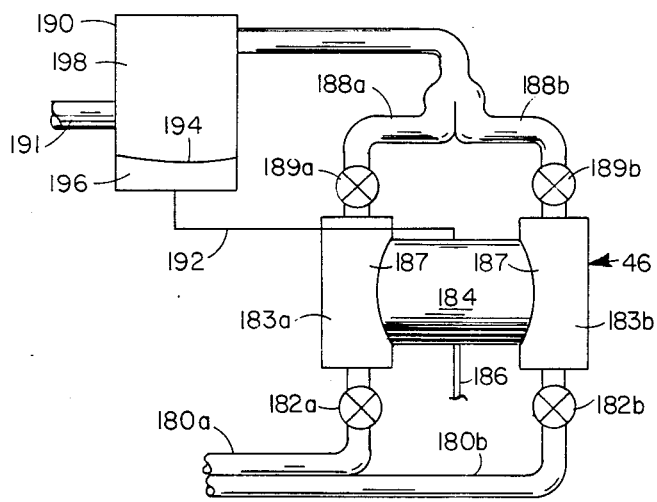
FIG. 10 is a schematic diagram of the pumping apparatus shown in perspective view in FIG. 9.

Referring now to FIGS. 9 and 10, the pumping system for the insulating material is shown. The pump 46 is mounted in a cradle 176 which is mounted to the crossbraces 178 of frame 72. The skirting 80 has been removed from the frame 72 in FIG. 9 for purposes of clarity. The insulating material enters the chambers 183a and 183b of pump 46 through lines 180a and 180b, having check valves 182a and 182b, respectively, therein. The pump 46 is a double diaphragm pump powered by the air pressure which enters chamber 184 through air pressure line 186. Positive displacement by both of the diaphragms 187 caused by the input of air pressure into chamber 184 causes the insulating material to be pumped out of the chambers 183a and 183b into lines 188a and 188b. Check valves 189a and 189b are provided in lines 188a and 188b, respectively, to prevent backward flow. To insure a smooth flow of insulating material in wave apparatus feed line 48 and top coating device feed line 50, a surge chamber 190 is provided in lines 188a and 188b. The air pressure in chamber 184 is directed to surge chamber 190 through connector line 192, and surge chamber 190 is provided with a diaphragm 194 which is positively displaced by the air pressure which enters the chamber 196 behind diaphragm 194 from chamber 184. Displacement of the diaphragm 194 in this manner iimposes a pulse of smaller magnitude on the insulating material in the chamber 198, thereby smoothing the flow of insulating material out of chamber 198 into the output line 191.

Figures 11, 12:
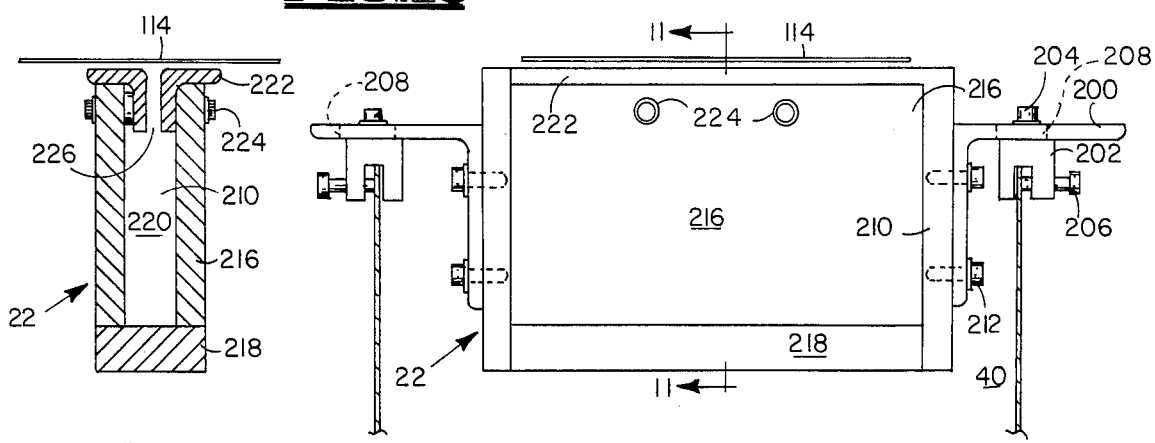
FIG. 11 is a cross-sectional view taken along the lines 11—11 in FIG. 12.
FIG. 12 is a longitudinal section through a portion of the apparatus of FIG. 2 taken along the lines 12—12 in FIG. 2.

Referring to FIGS. 11 and 12, the wave apparatus 22 is shown in enlarged detail. The wave apparatus 22 is mounted to the walls of the main reservoir 40 on brackets 200. The brackets 200 are secured to mounts 202 by bolt 204. The mounts 202 are provided with an adjusting bolt 206 to secure the wave apparatus 22 to the walls of the main reservoir 40. The brackets 200 are provided with a longitudinal slot 208 (see FIG. 2) to allow the movement of the wave apparatus 22 back and forth across the width of the main reservoir 40 to insure proper positioning with respect to a printed circuit board 114 which passes over the top thereof. The brackets 200 are secured to the end walls 210 of wave apparatus 22 by screws 212. The end walls 210 are integral with side walls 216 and floor 218, forming a narrow trough 220. At the top edge of the trough 220, a pair of formed angles 222 are mounted on adjusting screws 224 in closely opposed relationship on the side walls 216 of wave apparatus 22. The formed angles 222 form a narrow slot 226 therebetween such that, when insulating material is pumped under pressure into the trough 220 through wave apparatus feed line 48, the insulating material is forced up through the slot 226 and the pressure behind the insulating material causes the insulating material to spout up above formed angles 222 in the area of the slot 226 to form a wave. When a printed circuit board 114 is brought into close proximity with the wave produced by wave apparatus 22, the bottom of the printed circuit board 114 is coated with insulating material. The height of the wave produced by wave apparatus 22 can be varied by adjusting the amount of space between formed angles 222 with adjusting screws 224.

The operation of the apparatus of the present invention will now be explained by reference to the control panel 228 shown in FIG. 3. Control panel 228 is provided with a main power on switch 230 as well as an emergency off switch 232 and a reset button 234. Start up of the apparatus is delayed until the various fans come on as indicated by pilot light 236 and until the various subsystems power up as indicated by the pilot light 238. There are four subsystems, the first being the photo-eye number one subsystem having a pilot light at 240 to indicate the operational status of the identifier 66a. As will be explained, identifier 66a coordinates with the top coating device 24a and the pneumatic cylinder 70a of the top coating device 24a, and a pilot light is provided at 242 to monitor the status of pneumatic cylinder 70a. A manual switch 244 is provided to allow manual operation of the pneumatic cylinder 70a. The first subsystem is also provided with a pilot light 246 to monitor the status of pilot operated valve 42, and manual switch 248 for manual operation of valve 42.

The second subsystem is similar to the first, having a pilot light 250 to monitor the operation of identifier 66b, a pilot light 252 to monitor pneumatic cylinder 70b and a manual switch 254 for manual operation of that pneumatic cylinder 70b. Also provided is a pilot light 256 for monitoring the operation of pilot-operated valve 44 and a manual switch 258 for manual operation of that valve 44.

The third subsystem is the main apparatus control system, having a pilot light 260 to monitor the status of pump 46 and a switch 262 for manual operation of pump 46. A similar pilot light 264 is provided to monitor the air clutch/brake of the motor (not shown) which operates conveyor 20, a manual switch 266 being provided for manual operation of the clutch. A pilot light 268 is provided for monitoring the operational status of the motor which drives conveyor 20 and a manual switch 270 is provided for control thereof. A knob 272 is provided to select the speed of the conveyor 20, and a digital read out 274 provides an instantaneous reading of the speed.

The fourth subsystem is the heating system for the oven 28. A circuit is provided for one set of heating elements (not shown) with pilot light 276 indicating the status of that set of heating elements and thermostat 278 allowing the selection of the temperature created in the oven 28 by that set of heating elements. A second circuit is provided which is monitored by pilot light 280 providing information as to the operational status of a second set of heating elements (not shown), with a thermostat 282 providing for the regulation of the temperature in oven 28. Also provided on the control panel 228 is a status light 284 indicating the presence of a fire in oven 28, which is detected by an automatic detector (not shown) located in oven 28. Also included is an emergency shut off switch 286.

The various solenoid valves and electrical circuitry necessary for the operations provided for by the switches on control panel 228 are contained in circuit box 288, which is mounted to frame 72. Cable 289 provides the necessary connection of those solenoid valves from the electrical circuitry of control panel 228. Electrical cable 290 provides the necessary connections between circuit box 288 and the electrically operated proximity sensor 65 identifiers 66a and 66b.

Printed circuit boards 114 (not shown in FIG. 2) are mounted to conveyor 20 on the clips 104 and proceed around conveyor 20 until the leading edge of an extension arm 98 breaks the magnetic field produced by proximity sensor 65. Breaking the circuit in proximity sensor 65 causes the air clutch/brake of the motor (not shown) of conveyor 20 to be engaged for a predetermined period of time, thereby stopping conveyor 20 for that same period. As conveyor 20 coasts to a stop, the ram 68a of pneumatic cylinder 70a is extended, lowering the manifold 148 of top coating device 24a into close proximity with the printed circuit board 114. Identifier 66a is positioned in a predetermined location relative to top coating device 24a so that, after printed circuit board 114 breaks the photoelectric eye beam of identifier 66a, the pneumatic cylinder 68a of top coating device 24a is signalled to lower manifold 184a. After a predetermined delay, during which manifold 148a is moved downwardly into close proximity with printed circuit board 114, pilot-operated valve 42 is activated to allow the delivery of insulating material under pressure to the manifold 148 of top coating device 24a through line 52 by pump 46. Means (not shown) such as appropriate timers and electrical circuitry, or in a presently preferred embodiment, an appropriately programmed microprocessor, is provided to allow the timing, sequencing, and adjustment of these, and all other, operations.

Proximity sensor 65 can be provided with means (not shown) to adjust its position relative to top coating device 24a along conveyor 20 to provide the proper amount of space between proximity sensor 65 and the manifold 148a of top coating device 24a to compensate for the different speeds of the conveyor 20 and the distance a printed circuit board 114 mounted on conveyor 20 will travel in coasting to a stop after breaking the beam of proximity sensor 65. After an additional predetermined period of time, the clutch is engaged and brake released, and conveyor 20 once again advances, advancing the printed circuit boards 114 mounted thereon as well.

Also after a predetermined period of time has elapsed, pilot-operated valve 42 is closed and ram 68a is retracted into pneumatic cylinder 70a, thereby shutting off the flow of insulating material to manifold 148 and raising manifold 148 up away from the printed circuit board 114, providing the clearance necessary to advance printed circuit board 114 without interference from the lengths of flexible tubing 158. An over-ride is provided in the form of a switch and timer or appropriate programming of the above-described microprocessor to prevent movement of conveyor 20 until manifold 148a has been raised up away from the printed circuit board 114, thereby preventing the striking of any of the lengths of flexible tubing 158 on manifold 148a by the components mounted on printed circuit board 114 when conveyor 20 advances.

Referring once again to FIG. 8, it can be seen that the lengths of flexible tubing mounted on the fittings 154 of manifolds 148 extend downwardly into close proximity with the printed circuit board 114 positioned below the two respective top coating devices 24a and 24b. The flexible tubing 158 is constructed of stainless steel or material with similar properties to allow it to be bent to direct a flow of insulating material out of each length of flexible tubing 158 onto a predetermined location on the printed circuit board 114. As shown in FIG. 8, lengths of flexible tubing 158 of different length may also be utilized to better direct the flow of insulating material to the required location on the printed circuit board 114.

Also as shown in FIG. 8, the lengths of flexible tubing 158 on the top coating device 24a are positioned so as to direct a flow of insulating material to certain predetermined locations on one type of printed circuit board 114, and the lengths of flexible tubing 158 of top coating device 24b are positioned to direct a flow of insulating material onto certain predetermined locations on another type of printed circuit board 114. The formatting, i.e., the bending and positioning the lengths of flexible tubing 158 in this manner insures the complete coating of each type of printed circuit board 114. In the case of very large printed circuit boards 114, it may be necessary to use top coating devices 24a and 24b, having the lengths of flexible tubing 158 positioned differently on each, to insure adequate coverage. It will be recognized by those skilled in the art who have the benefit of this disclosure that additional top coating devices (not shown), each with a manifold of different format, can be placed along conveyor 20, adding the capability of coating several types of printed circuit boards. Each top coating device is provided with an indicator such as indicators 66a and 66b, positioned so that the beams of their respective photo-electric eyes are broken only by the printed circuit board for which the flexible tubing 158 of that particular top coating device is positioned.

Referring briefly to FIG. 7, it can be seen that the construction of the top coating devices 24a and 24b is also designed to maximize flexibility of operation. Once the lengths of flexible tubing 158 have been formatted for the coating of a particular printed circuit board 114 and the length of travel of ram 68 has been adjusted, manifold 148 can be removed from base 147 by merely unscrewing the two bolts 149, and a manifold with a different format (not shown), with the lengths of flexible tubing 158 adjusted for the coating of a different printed circuit board, substituted therefore.

Although the present invention has been described in terms of the above-described presently preferred embodiment, it will be recognized by those skilled in the art who have the benefit of this disclosure that a number of changes and alterations could be made to this device without changing its intended purpose and function. It is expected that all such changes and modifications will fall within the spirit and scope of the following claims.

What is claimed is:

1. An apparatus for coating printed circuit boards with insulating material which comprises:
   a manifold having an inlet in fluid communication with a source of insulating material and a plurality of outlets;
   a length of flexible tubing attached to each of said outlets, said tubing being selectively bendable to direct insulating material to a predetermined location on a printed circuit board;
   means for positioning a printed circuit board in a preselected, spaced relationship to said manifold which comprises a conveyer on which the printed circuit board is mounted, means for sensing the spaced relationship between the printed circuit board mounted on said conveyer and said manifold and means for stopping the movement of said conveyer for a predetermined period of time in response to said sensing means; and
   means for pumping a measured amount of insulating material through said manifold and out said lengths of flexible tubing onto the printed circuit boards.

2. The apparatus of claim 2 wherein said sensing means comprises a proximity sensor.

3. The apparatus of claim 2 wherein said manifold is provided with means to lower said manifold toward the printed circuit board mounted on said conveyor to bring the lengths of flexible tubing mounted on said manifold into close proximity therewith when said conveyer is stopped by said proximity sensor and to raise said manifold when said conveyer is started after said predetermined period of time.

4. The apparatus of claim 3 additionally comprising means for stopping the flow of insulating material when said manifold is raised and starting the flow of insulating material when said manifold is lowered.

5. The apparatus of claim 1 wherein said lengths of flexible tubing direct insulating material onto the top of the printed circuit board and means is provided in fluid communication with said pumping means to coat the bottom of the printed circuit board with insulating material.

6. The apparatus of claim 5 wherein said means for coating the bottom of the printed circuit board comprises a wave apparatus.

7. The apparatus of claim 1 which additionally comprises means for collecting and recirculating excess insulating material which runs off the printed circuit board.

8. The apparatus of claim 1 which additionally comprises means for heating the printed circuit boards onto which the insulating material has been directed to cure the insulating material into an insulating coating.

9. An apparatus for coating printed circuit boards with insulating material which comprises;
   a source of insulating material;
   a manifold in fluid communication with said source of insulating material;
   a conveyer for moving a printed circuit board mounted thereto under said manifold;
   means for sensing the space between a printed circuit board mounted on said conveyer and said manifold and means for stopping the movement of said conveyer for a predetermined period of time in response to a signal from said sensing means;
   a plurality of flexible nozzles in fluid communication with said manifold, said flexible nozzles being selectively bendable to direct a flow of the insulating material to predetermined locations on the top of the printed circuit board as the printed circuit board moves under said manifold on said conveyer; and
   means in fluid communication with said source of insulating material for coating the bottom of a printed circuit board with insulating material as the printed circuit board moves on said conveyer.

10. The apparatus of claim 9 wherein said means for coating the bottom of a printed circuit board comprises a wave coating apparatus.

11. The apparatus of claim 9 wherein said sensing means comprises a proximity sensor.

12. The apparatus of claim 9 wherein said manifold isi provided with means for lowering said manifold toward the printed circuit board mounted on said conveyer when said conveyer is stopped by said space sensing means, thereby lowering said flexible nozzles into close proximity to the printed circuit board, and for raising said manifold when said conveyer is started after said predetermined period of time.

13. The apparatus of claim 12 additionally comprising means for stopping the flow of insulating material when said manifold is raised and starting said flow of insulating material when the manifold is lowered.

14. The apparatus of claim 9 which additionally comprises means for collecting and recirculating excess insulating material which runs off of printed circuit boards.

15. The apparatus of claim 9 which additionally comprises means for heating the printed circuit board after a flow of insulating material has been directed thereon to cure the insulating material into an insulating coating.

16. A method of coating printed circuit boards with insulating material comprising:

mounting a printed circuit board to a conveyor and moving the conveyor;

stopping the conveyor when the printed circuit board is under a manifold having a plurality of lengths of flexible tubing mounted thereto, each of said lengths of flexible tubing being in fluid communication with a source of insulating material;

bending said lengths of flexible tubing to direct a flow of insulating material to predetermined locations on the printed circuit board under said manifold; and delivering a measured flow of insulating material to the printed circuit board through said lengths of flexible tubing.

17. The method of claim 16 further comprising passing the printed circuit board over a wave of insulating material while said conveyor is moving to coat the bottom of the printed circuit board.

18. The method of claim 16 further comprising mounting the printed circuit board to said conveyor at an angle to cause excess insulating material to run off of the printed circuit board.

19. The method of claim 18 wherein said excess insulating material is collected and recirculated.

20. The method of claim 16 additionally comprising heating the printed circuit board after the flow of insulating material has been directed thereon to cure the insulating material.

21. The method of claim 16 wherein said manifold is lowered toward the printed circuit board mounted on said conveyor when the printed circuit board is under said manifold and raised when said conveyor is moving.

* * * * *